(12) United States Patent
Talakoub et al.

(10) Patent No.: US 10,904,669 B1
(45) Date of Patent: Jan. 26, 2021

(54) SYSTEM FOR PRESENTATION OF AUDIO USING WEARABLE DEVICE

(71) Applicant: AMAZON TECHNOLOGIES, INC., Seattle, WA (US)

(72) Inventors: Shahram Talakoub, San Jose, CA (US); Jianchun Dong, Palo Alto, CA (US); Peng Zhang, Cupertino, CA (US); Yuwen Su, Cupertino, CA (US); Xuan Zhong, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 16/712,299

(22) Filed: Dec. 12, 2019

Related U.S. Application Data

(60) Provisional application No. 62/905,574, filed on Sep. 25, 2019.

(51) Int. Cl.
| | |
|---|---|
| *H04R 1/32* | (2006.01) |
| *H04R 5/04* | (2006.01) |
| *H04R 3/04* | (2006.01) |
| *H03G 5/16* | (2006.01) |
| *H04S 7/00* | (2006.01) |
| *G02B 27/01* | (2006.01) |
| *H04R 1/02* | (2006.01) |
| *H04R 1/10* | (2006.01) |
| *H04R 1/20* | (2006.01) |
| *H04R 3/12* | (2006.01) |

(52) U.S. Cl.
CPC .............. *H04R 5/04* (2013.01); *G02B 27/017* (2013.01); *H03G 5/165* (2013.01); *H04R 1/028* (2013.01); *H04R 1/1083* (2013.01); *H04R 1/20* (2013.01); *H04R 1/32* (2013.01); *H04R 3/04* (2013.01); *H04R 3/12* (2013.01); *H04S 7/301* (2013.01); *G02B 2027/0178* (2013.01); *H04R 2430/01* (2013.01)

(58) Field of Classification Search
CPC . H04R 1/20; H04R 1/32; H04R 1/323; H04R 1/345; H04R 1/347; H04R 1/38; H04R 5/023; H04R 5/0335
See application file for complete search history.

(56) References Cited

U.S. PATENT DOCUMENTS

| | | | | |
|---|---|---|---|---|
| 5,809,153 | A | * | 9/1998 | Aylward ................... H04R 1/20 381/160 |
| 2013/0051585 | A1 | * | 2/2013 | Karkkainen ......... H04R 1/1075 381/151 |

* cited by examiner

*Primary Examiner* — Kile O Blair
(74) *Attorney, Agent, or Firm* — Lindauer Law, PLLC

(57) ABSTRACT

A head-mounted wearable device (HMWD) provides audio output from a first speaker that is driven with a first signal and a second speaker that is driven with a second signal. Based on a volume level setting, an equalization profile and inversion frequency are determined. The equalization profile selectively amplifies or attenuates particular frequencies or ranges of frequencies. Those frequencies in the second signal that are above the inversion frequency have their amplitude inverted, relative to the first signal. When driven by the first signal and the second signal, the first speaker and the second speaker operate as acoustic dipoles below the inversion frequency and acoustic quadrupoles above the inversion frequency. Sound from the first and second speakers with frequencies above the inversion frequency exhibits destructive interference. As a result, the user wearing the HMWD is able hear audio output while audio amplitude perceived by the bystanders is significantly reduced.

21 Claims, 10 Drawing Sheets

AUDIO CONTROL DATA 140

AUDIO CONTROL DATA 140(1)

| AMBIENT NOISE LEVEL (RANGE 0-255) 602 | OUTPUT VOLUME (RANGE 0-16) 138 |
|---|---|
| 0-16 | 1 |
| 17-32 | 2 |
| 33-48 | 3 |
| 49-64 | 4 |
| ... | ... |

AUDIO CONTROL DATA 140(2)

| AMBIENT NOISE LEVEL (RANGE 0-255) 602 | OUTPUT VOLUME (RANGE 0-16) 138 | AUDIO TYPE DATA 128 | EQUALIZATION PROFILE 144 | INVERSION FREQUENCY (HERTZ) 150 | INDICATOR OUTPUT DATA 154 |
|---|---|---|---|---|---|
| 0-255 | 1-6 | PHONE | 1 | 500 | NONE |
| 0-101 | 7-9 | PHONE | 2 | 3000 | GREEN |
| 0-101 | 10-13 | PHONE | 3 | 3000 | YELLOW |
| 0-101 | 14-16 | PHONE | 3 | 7000 | RED |
| 0-255 | 1-6 | ENTERTAINMENT | 1 | 500 | NONE |
| 0-255 | 7-9 | ENTERTAINMENT | 4 | 3000 | GREEN |
| 0-101 | 10-13 | ENTERTAINMENT | 5 | 3000 | YELLOW |
| 0-101 | 14-16 | ENTERTAINMENT | 5 | 7000 | RED |
| 102-255 | 1-6 | PHONE | 6 | 600 | NONE |
| ... | ... | ... | ... | ... | ... |

FIG. 6

SYSTEM FOR PRESENTATION OF AUDIO USING WEARABLE DEVICE

PRIORITY

This application claims priority to, and the benefit of, U.S. Patent Application Ser. No. 62/905,574 filed on Sep. 25, 2019, titled "SYSTEM FOR PRESENTATION OF AUDIO USING WEARABLE DEVICE", the contents of which are hereby incorporated by reference into the present disclosure.

BACKGROUND

Wearable devices provide many benefits to users, allowing easier and more convenient access to information and services. Wearable devices may provide output that is audible to the user.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

FIG. 6 illustrates audio control data that may be used by an audio control module to operate the acoustic units, according to some implementations.

Figure 1:
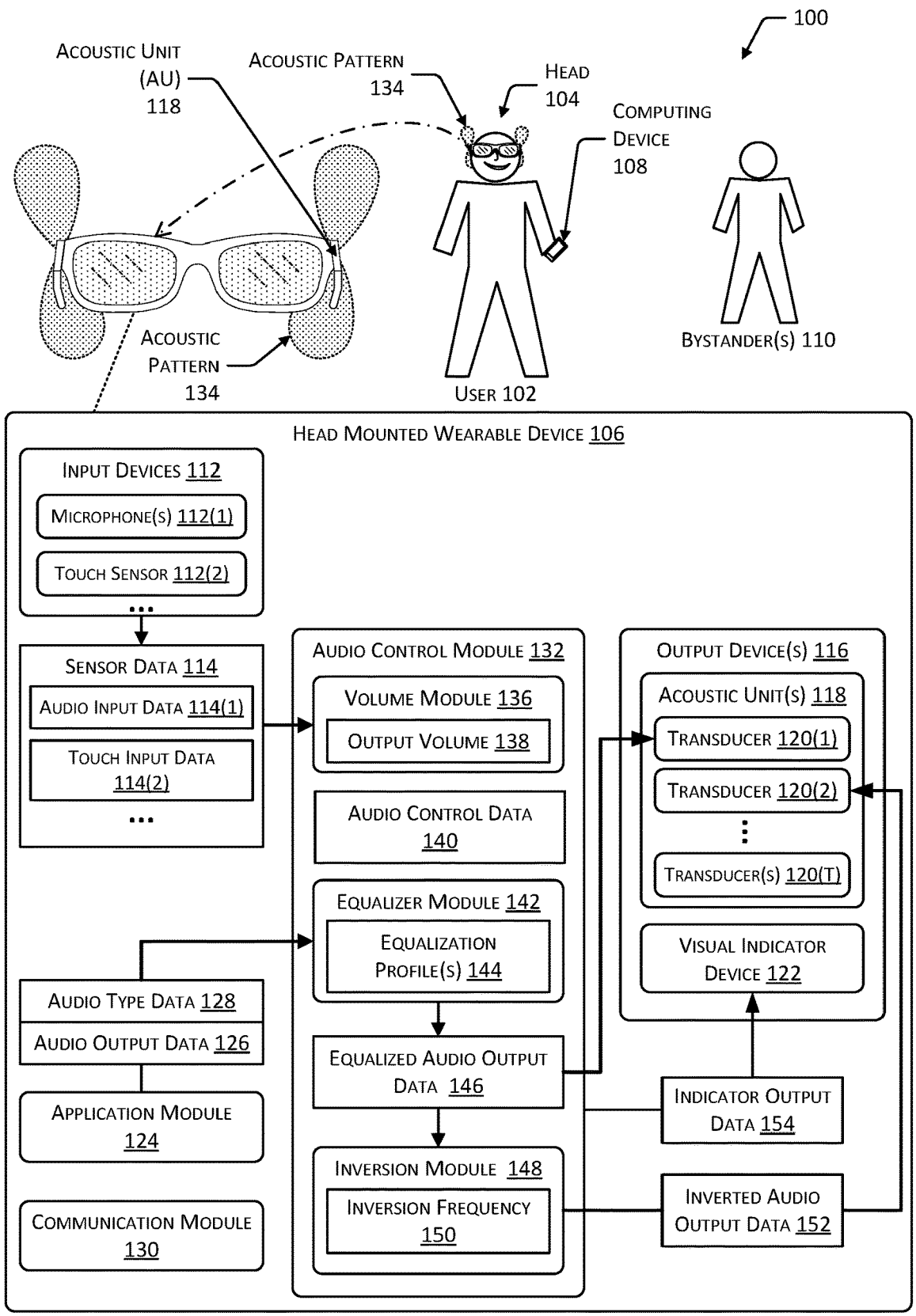
FIG. 1 depicts a system including a head-mounted wearable device (HMWD) equipped with acoustic units (AU) operated to minimize sound leakage to bystanders, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean "including, but not limited to".

The structures depicted in the following figures are not necessarily according to scale. Furthermore, the proportionality of one component to another may change with different implementations. In some illustrations the scale or a proportionate size of one structure may be exaggerated with respect to another to facilitate illustration, and not necessarily as a limitation.

DETAILED DESCRIPTION

Wearable devices provide many benefits to users, allowing easier and more convenient access to information and services. For example, a head-mounted wearable device (HMWD) having a form factor that is ubiquitous and easily worn, such as eyeglasses, may facilitate access to information.

The HMWD may operate independently as a standalone device, or may operate in conjunction with another computing device. For example, the HMWD may operate in conjunction with a smart phone, tablet, network service operating on servers, and so forth. The HMWD includes input devices and output devices that provide a user interface to the user. In one implementation, the HMWD may use the computing device to provide access to a wide area network, compute resources, data storage, a display for image output, and so forth.

Among the input devices, the HMWD may include one or more microphones, such as an air conduction microphone (ACM) that detects sounds transferred by air. The HMWD may also include other sensors, such as touch sensors, ambient light sensors (ALS), and so forth.

The HMWD may include as an output device one or more an acoustic units (AUs). The AU provides sound that is audible to the user during operation while minimizing leakage to the surrounding environment when operated as described herein. The AU may comprise a pair of emitters. Each emitter may comprise a transducer and have, or be connected to, two or more outlet ports that convey the sound to the outside environment. For example, a first duct directs sound from a first side of the transducer to a first outlet port while a second duct directs sound from a second side of the transducer to a second outlet port. The pair of emitters may be oriented such that the first outlet ports of each of the two emitters are adjacent to one another, while the second outlet ports of each of the two emitters are adjacent to one another.

In one implementation, the AU may comprise an emitter with a diaphragm that is driven by a transducer, such as a voice coil. The transducer converts electrical signals into mechanical motion. During operation, the transducer moves the diaphragm to displace air, producing sound. The diaphragm acts as a pair of acoustic point sources with opposing outputs that are 180 degrees out of phase. For example, when driven, a first side of the diaphragm produces a positive sound pressure compression wave with a first amplitude while the opposite second side of the diaphragm produces a negative sound pressure rarefaction wave with the first amplitude.

The HMWD may be used in situations in which bystanders or microphones of other devices are present. In such situations, it is desirable to allow the user wearing the HMWD to be able to listen to audio output without being obtrusive to those bystanders. Additionally, the user may not wish the audio to be intelligible to the bystanders. For example, the user may not wish to have the audio of a telephone call heard by the bystanders. Additionally, the user of the HMWD may not wish to obscure their ears and their hearing of the ambient environment. For example, the user may not wish to wear earplugs that would prevent conversation with bystanders or obscure the user's ability to hear what is happening in the environment.

Described in this disclosure are techniques and systems to selectively drive transducers in the acoustic units to provide sound that is audible to the user but is inaudible or unintelligible to bystanders. An audio control module generates output that, when used to drive the transducers in the acoustic units, results in the transducers operating as acoustic dipoles when presenting output with a frequency below a specified inversion frequency and as acoustic quadrupoles when presenting output with a frequency above the specified inversion frequency. The output while operating as acoustic quadrupoles is phase inverted, producing destructive interference. The destructive interference reduces the amplitude of sound that propagates into the environment, reducing the apparent intensity of the sound to the bystanders.

The audio control module is responsive to one or more inputs such as ambient noise level, output volume setting of the HMWD, or audio type of the audio to be presented. Audio output data may be provided by an application, such as a telephone application, music player application, and so forth. The audio output data may comprise pulse code modulated (PCM) data representative of an analog audio signal.

The audio output data may be processed by applying an equalization profile to provide equalized audio output data. The equalization profile, when applied to the audio output data, selectively amplifies or attenuates one or more frequency bands. For example, the equalization profile may be used to "flatten" the response of a transducer that otherwise exhibits a sharp resonance peak at a particular frequency and improve the quality of the sound when presented by the acoustic unit. In one implementation, a particular equalization profile may be selected from a plurality of available equalization profiles based on the output volume.

The equalized audio output data may be processed by an inversion module. The inversion module may determine an inversion frequency based on the output volume. For example, given output volume within a first range, a particular inversion frequency may be selected. The inversion module processes the equalized audio output data to produce inverted audio output data in which amplitude values associated with portions of the signal having a frequency greater than or equal to the inversion frequency are inverted or flipped. In one implementation, a sign associated with data indicative of amplitude for a sample may be flipped from positive to negative, or vice versa. For example, the inversion frequency may be 3000 Hertz (Hz) and a sample of the PCM data represents an analog signal with a frequency of 4170 Hz and an amplitude value that would result in a voltage at the transducer of positive 1.1 volts. The inversion module would invert by generating a sample which represents an analog signal with the frequency of 4170 Hz but with an amplitude value that would result in a voltage at the transducer of negative 1.1 volts. For example, an amplitude sign value associated with data in a sample may be flipped.

During operation of the system the equalized audio output data is used to operate a first transducer. For example, the equalized audio output data may be provided as input to a first digital to analog converter (DAC) that produces as output a first analog signal. The first analog signal may then be amplified and used to drive the first transducer. Meanwhile, the inverted audio output data is used to operate a second transducer. Continuing the example, the inverted audio output data may be provided as input to a second DAC that produces as output a second analog signal. The second analog signal may then be amplified and used to drive the second transducer.

While the first analog signals and the second analog signals are being presented by the respective first and second transducers, operation of the pair of transducers dynamically changes based on the frequency of the sound being presented. When the sound being presented has a frequency less than the inversion frequency, the pair of transducers are being driven by signals in which the amplitudes are not inverted, and the pair of transducers operate as acoustic dipoles. When the sound being presented has a frequency greater than the inversion frequency, the pair of transducers are driven by signals in which the amplitudes are inverted. For example, at a given instant while the first transducer is driven with a signal having a positive voltage, the second transducer is driven with a signal having a negative voltage. As a result, the sound produced by the second transducer is "opposite" that of the sound produced by the first transducer. For example, in that moment while the first transducer creates a compression soundwave the second transducer creates a rarefaction soundwave. In some implementations the amplitudes of the signals driving the transducers may differ.

During the times while the transducers are operating as acoustic quadrupoles, the resulting sound from the transducers may interact to create destructive interference. As a result, the user wearing the HMWD is able to hear the audio being presented, while bystanders or microphones farther away experience a substantial decrease in the apparent volume, or sound pressure level, due to the destructive interference. The user remains able to comfortably listen to audio output while bystanders are not.

The HMWD may have other output devices, such as a visual indicator device (VID). The VID may comprise a light emitting diode (LED) that emits light from a portion of a frame of the HMWD within the user's field of view.

In some implementations the user may be provided with an indicator as to how far the sound from the HMWD is expected to carry. This may be based on characteristics of the audio control model, sensor data, or a combination thereof. For example, the visual indicator device (VID) may be illuminated based on one or more operating parameters of the audio control module. Continuing the example, if the output volume is set to maximum and an ambient noise level as indicated by audio input data is less than a first threshold value, the VID may be illuminated red, indicating that bystanders within a specified distance may be able to hear the presented audio clearly. Similarly, if the output volume is set to maximum and the ambient noise level is greater than a second threshold value, the VID may be illuminated green, indicating that bystanders within the specified distance are likely unable to hear the presented audio clearly.

The techniques and systems described in this disclosure may be used with regard to other devices or environments. The acoustic units and audio control module may be used to provide output within a vehicle, office, home, theater, and so forth. For example, the acoustic units may be installed within a vehicle to allow one occupant to listen to audio while minimizing leakage of that audio to other occupants. In another implementation, the acoustic units may be installed and used within furniture. For example, a chair may have acoustic units installed such that they are near the head of a user sitting in the chair and provide audio to the seated user while minimizing leakage of sound beyond the chair.

By utilizing the devices and techniques described in this disclosure, sound from the AU may be audible to a user, while reducing one or more of the intelligibility or amplitude of sound perceived by bystanders or microphones in the environment. This improves privacy for the user while also minimizing adverse impact on bystanders resulting from hearing unwanted audio. The user may thus maintain the functionality to utilize audio output while reducing the likelihood of annoyance of or eavesdropping by bystanders.

Illustrative System

FIG. 1 depicts a system 100 in which a user 102 is wearing on their head 104 a head-mounted wearable device (HMWD) 106 in a general form factor of eyeglasses. The HMWD 106 may incorporate hinges to allow the temples of the eyeglasses to fold. The HMWD 106 may include one or more lenses. The lenses may be shaped to provide a particular refractive effect on light rays, such as in the case of prescription lenses.

The HMWD 106 may be in communication with one or more affiliated computing devices 108. For example, the HMWD 106 may communicate with the computing device 108 using a personal area network (PAN) such as Bluetooth. The computing device 108 may be used at least in part to provide additional resources, such as access to the network, compute resources, storage, display output, and so forth. The computing devices may comprise a smart phone, tablet, local server, in vehicle computer system, and so forth. For example, the computing device 108 may comprise a smart phone that includes a display. The display of the smart phone may be used to present a graphical user interface.

In some situations, there may be bystanders 110 near the HMWD 106. For example, the user 102 wearing the HMWD 106 may be standing in a crowd, sitting on a bus, sitting in an auditorium, walking down a street, and so forth.

The HMWD 106 may include one or more input devices 112. For example, the HMWD 106 may include one or more of a microphone 112(1), touch sensor 112(2), button, ambient light sensor (ALS), and so forth. The input devices 112 may produce sensor data 114. In some implementations a sensor may be used to determine if the HMWD 106 is being worn or not. For example, a proximity sensor may be used to determine if the head 104 of the user 102 is near the HMWD 106.

The microphones 112(1) may include one or more of bone conduction microphones (BCM) or air conduction microphones (ACM), and so forth. The microphones 112(1) are used to produce audio input data 114(1). For example, the BCM may comprise an accelerometer, gyroscope, vibration sensor, and so forth that detect the vibrations in the head of the user 102 that result from utterances of the user 102. The ACM may comprise a diaphragm or other elements that move in response to the displacement of air by sound waves. The audio input data 114(1) may comprise digitized audio, such as pulse code modulated (PCM) audio data.

The touch sensor 112(2) may be located on one or more of the temples of the HMWD 106. The touch sensor 112(2) may comprise a capacitive touch sensor, a force sensitive resistor touch sensor, an optical touch sensor, and so forth. The touch sensor 112(2) may generate touch input data 114(2) that is indicative of the location, direction, duration and so forth of the touch. For example, the touch input data 114(2) may comprise a serialized data stream indicative of particular points on the touch sensor 112(2) that detect a touch.

The ALS may generate light sensor data. The light sensor data may comprise information about the ambient lighting proximate to the HMWD 106. The light sensor data may include intensity data and color data. Other sensors may provide other sensor data 114.

The HMWD 106 may include one or more output devices 116. For example, the HMWD may include one or more acoustic units (AU) 118 comprising one or more transducers 120, a visual indicator device (VID) 122, haptic output devices, and so forth.

An AU 118 may comprise one or more emitters. The emitters are configured to produce acoustic or audio output. For example, the emitters may include a transducer 120 that displaces a diaphragm to cause sound waves comprising compression and rarefaction in air. Each emitter may operate as an acoustic dipole having two outlet ports. A single diaphragm within the emitter may be moved with an electromagnet to product vibrations in the air, and thus sound. The sound on a first side of the diaphragm exhibits a first phase and exits through a first outlet port while the sound on the second side of the diaphragm exhibits a second phase that is 180 degrees different from the first phase and exits through a second outlet port. For example, when the diaphragm moves to the left it creates a compression wave (wave front of greater density) in the air and simultaneously to the right of the diaphragm it creates a rarefaction (area of lesser density) wave. As described below with regard the audio control module 132, depending on the signals used to drive the transducers 120, at any given time the AU 118 may operate as a pair of acoustic dipoles or as an acoustic quadrupole.

The transducers 120 may include, but are not limited to, electromagnets such as voice coils, piezoelectric devices, metallic ribbon devices, magnetostrictive devices, electrostatic devices, and so forth. In some implementations, the transducers 120 may operate to produce sound up to 20 kHz.

The HMWD 106 may include an application module 124. The application module 124 may provide an application such as a telephony application to facilitate a realtime call (RTC), an audio player application to listen to music content such as music, audiobooks, or podcasts, and so forth. The application module 124, or other modules of the HMWD 106 may provide audio output data 126. The audio output data 126 comprises digitized data that is representative of sound. For example, the audio output data 126 may comprise PCM data. In some implementations audio type data 128 may be determined. The audio type data 128 may be indicative of one or more categories that the associated audio output data 126 corresponds to. For example, the audio type data 128 may be indicative of "phone", "entertainment", "alarm", and so forth. In some implementations the audio type data 128 may be included in the audio output data 126. In other implementations other modules, such as an operating system (OS) module, may provide the audio type data 128 at a given time.

The HMWD 106 may also include a communication module 130. The communication module 130 may be configured to establish communication with other devices. The communication module 130 may use one or more communication interfaces to establish communication with the other devices via one or more networks. For example, the network may comprise a personal area network, local area network, metropolitan area network, wide area network, and so forth. The HMWD 106 may use the networks to access one or more services that are provided by the other devices. For example, the HMWD 106 may establish communication with one or more servers. These one or more servers may provide one or more services, such as automated speech recognition, information retrieval, communication with other users, providing a telephone call, retrieving audio output data 126 for presentation, and so forth.

The HMWD 106 may include an audio control module 132. The audio control module 132 uses one or more of the AUs 118 to provide audio output to the user 102. During operation, the AU 118 may produce an acoustic pattern 134. The acoustic pattern 134 may be expressed as a region having a surface upon which a predetermined value of sound pressure is measured. During operation, the acoustic pattern 134 produced by the AU 118 may comprise two regions arranged in a "dumbbell" or "figure eight" configuration. For example, a first region may extend from one side of the AU 118 and a second region may extend from an opposite side of the AU 118. The regions may be aligned along a major axis extending through a long axis of each of the regions. In some implementations other acoustic patterns 134 may be used. For example, the acoustic pattern 134 may comprise four regions. The acoustic pattern 134 may be approximately symmetrical. The major axis of the acoustic pattern 134 may be aligned to extend upwards and away from where the ear of the user 102 is expected to be while the device is being worn. For example, the ear of the user 102 is within a lower region while the upper region extends upwards and away from the head 104. The acoustic pattern 134 may change dynamically, responsive to the audio control module 132.

The AU 118 may use a plurality of ports to radiate sound with particular phases to produce a particular acoustic pattern 134. For example, a single acoustic dipole produces a pattern with two broad regions exhibiting little directionality and a slight null. In some implementations the AU 118 may be operated to produce an interaction between the sound emitted in the outlet ports that produces constructive or destructive interference of sound waves from the AU 118. For example, sound from an AU 118 that is produced by a first transducer 120(1) from a non-inverted signal may have a positive phase while sound produced by a second transducer 120(2) from an inverted signal may have a negative phase, resulting in the AU 118 operating as an acoustic quadrupole. These two phases as emitted from adjacent outlets would destructively interfere, reducing the amplitude or sound pressure level as measured at a distance from the outlet ports. As a result of this destructive interference, the resulting acoustic pattern 134 may encompass a smaller spatial region compared to the directivity pattern when the same AU 118 is operated as an acoustic dipole.

During operation, the sound pressure, amplitude, or apparent volume of sound produced by the AU 118 while the audio control module 132 is in operation is significantly reduced, relative to the regions of the acoustic pattern 134. For example, at a distance of 1 meter, the sound pressure at a 2 meter height may be 15 decibels (dB) less than when the inversion module 148, described below, is in use. As a result, bystanders 110 will experience audio that is significantly attenuated, compared to the user 102 who has their ear within one of the regions. As a result, the privacy of the audio presented to the user 102 is improved, potential for distraction or annoyance of bystanders 110 or acquisition of usable audio by a microphone in the environment is reduced, and so forth.

The audio control module 132 may comprise a volume module 136. The volume module 136 may accept as input sensor data 114 and determine output volume 138. The output volume 138 may comprise a value or other data that is representative of loudness of output from the AUs 118 during operation.

The user 102 may provide input to the HMWD 106 to set a desired output volume 138. For example, the user 102 may use a spoken command acquired by a microphone 112(1), such as the user 102 saying "increase volume to 10". An automated speech recognition (ASR) system may be used to determine one or more instructions that correspond with the speech. In another example, the user 102 may use a touch sensor 112(2) to provide touch input data 114(2) that is used to determine the output volume 138.

In some implementations the volume module 136 may use audio input data 114(1) to determine an ambient noise level. For example, the ambient noise level may be determined by periodically sampling the amplitude of signals represented by individual frames of audio input data 114(1). The sampling may be performed such that intelligible speech is not acquired during the sample. The volume module 136 may use the ambient noise level as input to determine the output volume 138. For example, as the ambient noise level increases, the output volume 138 increases as well. Continuing the example, as the ambient noise level decreases, the output volume 138 decreases as well.

In some implementations the volume module 136 may use sensor data 114 from other sensors. For example, ambient light sensor data from the ALS may be used to determine an ambient light level. The volume module 136 may use the ambient light level as input to determine the output volume 138. For example, as the ambient light level increases, the output volume 138 increases as well. Continuing the example, as the ambient light level decreases, the output volume 138 decreases as well.

In some implementations the volume module 136 may use data from other modules. For example, the OS module may indicate that the HMWD 106 is in a quiet or "do not disturb" mode and the volume module 136 may set the output volume 138 to zero (mute).

The audio control module 132 may utilize audio control data 140 during operation of one or more modules. The audio control data 140 is described in more detail with regard to FIG. 6.

An equalizer module 142 applies one or more equalization profiles 144 to the audio output data 126 to determine equalized audio output data 146. The equalization profiles 144 comprise data that specifies one or more frequencies or frequency bands that are to be selectively amplified or attenuated. For example, the equalization profile 144 may be representative of a notch filter in which frequencies that are within a specified range are attenuated by a specified number of decibels. An equalization profile 144 may include a first frequency band that is attenuated and a second frequency band that is amplified.

Figure 7:
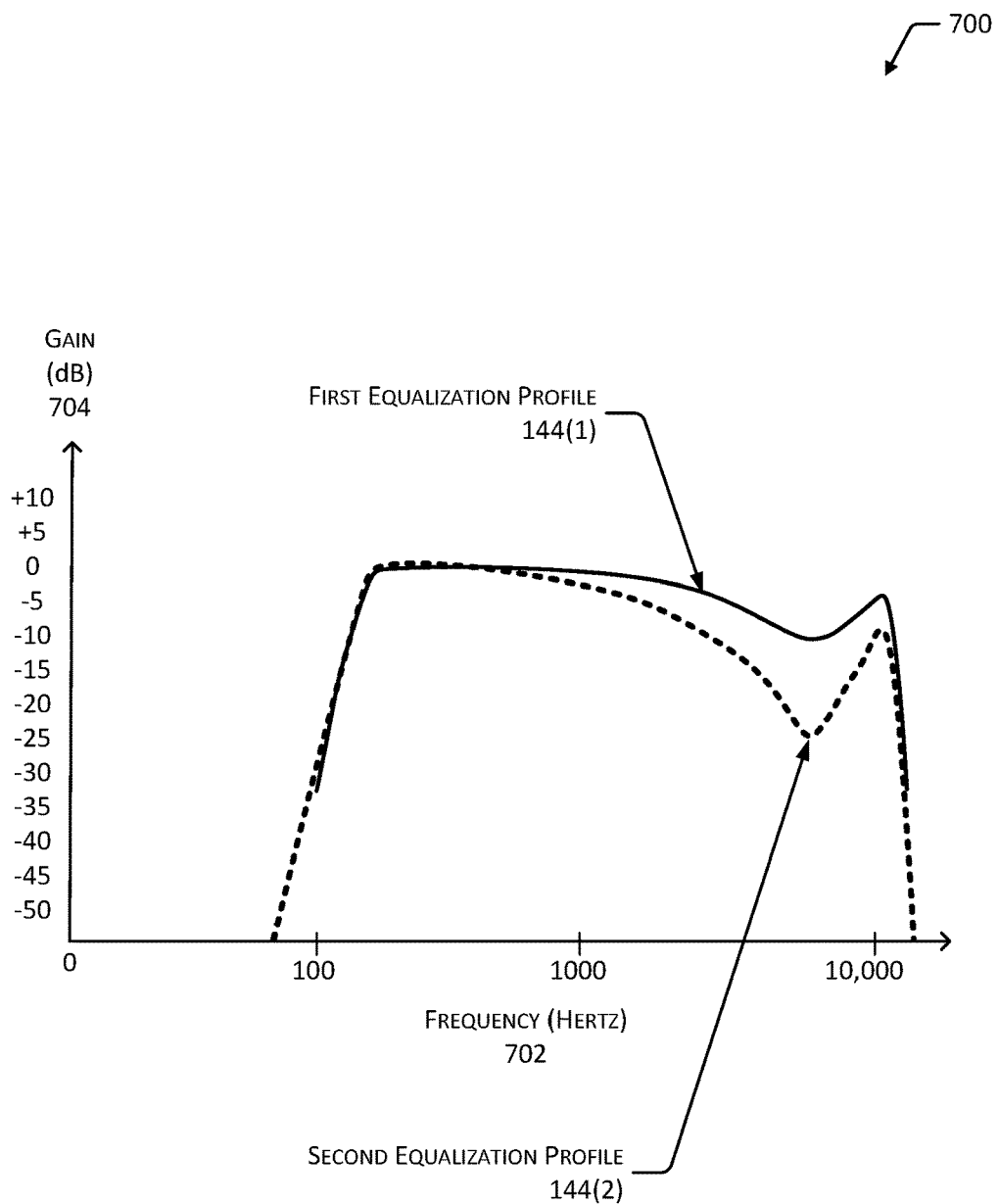
FIG. 7 shows a graph of two equalization profiles, according to some implementations.

The use of an equalization profile 144 allows the resulting output from the AU 118 to be modified. These modifications may be done for various purposes. For example, the equalization profile 144 may be used to "flatten" the response of a particular type of transducer 120 that otherwise exhibits a sharp resonance peak at a particular frequency. The result of the equalization may be to improve the quality of the sound when presented by the AU 118. In another example, a particular equalization profile 144 may be used to attenuate particular frequencies that may be more easily propagated to a bystander 110. In yet another example, a particular equalization profile 144 may be used to adjust for specific hearing loss of the user 102, accommodate a personal preference, and so forth. A graph showing different equalization profiles 144 is shown in FIG. 7.

The equalizer module 142 may determine a particular equalization profile 144 from a plurality of equalization profiles 144 based on one or more inputs. In one implementation, a combination of one or more of ambient noise level, output volume 138, or audio type data 128 may be used to select a particular equalization profile 144. For example, given a particular ambient noise level of 97 and the output volume 138 of 5, a first equalization profile 144(1) may be used. Selection of the equalization profile 144 is discussed in more detail with regard to FIG. 6.

The equalized audio output data 146 may be used to operate a first transducer 120(1) in an acoustic unit 118. For example, the equalized audio output data 146 may be provided as input to a first digital to analog converter (DAC) that produces as output a first analog signal. The first analog signal may then be amplified and used to drive the first transducer 120(1).

The audio control module 132 may include an inversion module 148. In addition to the first transducer 120(1) in an AU 118, the equalized audio output data 146 is also provided to the inversion module 148. The inversion module 148 determines an inversion frequency 150 and determines inverted audio output data 152. The inversion frequency 150 specifies a frequency above which a signal is to have its amplitude inverted. In one implementation, a sign associated with data indicative of amplitude for a sample may be flipped from positive to negative, or vice versa. For example, the inversion frequency 150 may be 500 Hz and a digitized sample in the equalized audio output data 146 represents an analog signal with a frequency of 740 Hz with an amplitude value that would result in a voltage at the transducer 120 of positive 1.1 volts. The inversion module 148 would invert by generating a sample or modifying the sample to represent an analog signal with the frequency of 740 Hz but with an amplitude value that would result in a voltage at the transducer 120 of negative 1.1 volts.

In some implementations the inversion of the portion of the audio output data that is greater than the inversion frequency 150 may be performed by other components. For example, the DAC associated with a transducer 120 may be configured to perform a polarity inversion for signals greater than the inversion frequency 150.

The inversion module 148 may determine a particular inversion frequency 150 based on one or more inputs. In one implementation, a combination of one or more of ambient noise level, output volume 138, equalization profile 144 selected, or audio type data 128 may be used to select a particular inversion frequency 150. For example, given a particular ambient noise level of 97 and the output volume 138 of 5, an inversion frequency of 500 may be used. In another example, a function using the output volume 138 as input may be used to determine the inversion frequency 150. Continuing the example, the function may be a step function, linear function, logarithmic function, geometric function, and so forth. Selection of the inversion frequency 150 is discussed in more detail with regard to FIG. 6.

The inversion module 148 is selectively inverting only those portions of the equalized audio output data 146 that represent signals with a frequency greater than the inversion frequency 150. The remaining portions of the equalized audio output data 146 that represent signals with frequencies less than the inversion frequency 150 retain their original amplitude.

While the equalized audio output data 146, which is non-inverted, is used to operate the first transducer 120(1) in the AU 118, the inverted audio output data 152 is used to operate the second transducer 120(2) in the AU 118. For example, the inverted audio output data 152 may be provided as input to a second DAC that produces as output a second analog signal. The second analog signal may then be amplified and used to drive the second transducer 120(2).

In another implementation the equalizer module 142 may be omitted. For example, the inversion module 148 may accept as input the audio output data 126.

In some implementations other processing may be applied to the audio data before being used to operate the respective transducers 120. For example, a beamforming module (not shown) may utilize one or more beamforming algorithms to modify the acoustic pattern 134. In another example, dynamic range compression (DRC) may be applied by the audio control module 132, by circuitry associated with the acoustic units 118, and so forth. In another example a limiter or compressor may be used to process the audio output data 126.

Operation of the audio control module 132 may be changed responsive to whether the user 102 is wearing the HMWD 106 or not. For example, when not being worn, the audio control module 132 may be configured to provide a different acoustic pattern 134. Continuing the example, when doffed, the audio control module 132 may disable the inversion module 148 and operate the AU 118 as an acoustic dipole to increase sound emitted into the environment, allowing the audio to be heard in the surrounding environment.

The audio control module 132 is discussed with regard to providing a single channel or monoaural audio for ease of illustration and not necessarily as a limitation. It is understood that the HMWD 106 or other device may support multichannel audio, such as stereo, surround sound, and so forth. For example, a plurality of AUs 118 may be operated as described above to provide multichannel sound such as stereo sound for the user 102 of the HMWD 106.

As mentioned above, the output devices 116 of the HMWD 106 may include the visual indicator device (VID) 122. The VID 122 may comprise a light emitting diode (LED) that emits light from a portion of a frame of the HMWD 106 that is within the user's field of view. The audio control module 132 may determine indicator output data 154 that is used to operate the VID 122 to provide the user 102 with an indicator as to how far the sound from the HMWD 106 is expected to carry. Such an indicator may assist the user 102 in determining whether additional measures, such as decreasing the output volume 138 or discontinuing audio presentation would be desirable.

The audio control module 132 may determine the indicator output data 154 based on one or more of ambient noise level, output volume 138, audio type data 128, equalization profile 144 selected, inversion frequency 150 selected, or other factors. For example, if the output volume 138 is set below a first threshold and an ambient noise level as indicated by audio input data 114(1) is less than a second threshold value, the VID 122 may operate to illuminate yellow, indicating that bystanders within a specified distance may be able to hear the presented audio. Determination of the indicator output data 154 is discussed in more detail with regard to FIG. 6.

In other implementations other indicator output data 154 may be provided. For example, the indicator output data 154 may comprise an icon or graphic that is presented on a display device. The indicator output data 154 may also include audio data. For example, an earcon or brief audio prompt such as a chime may be presented using the AUs 118. Continuing the example, after a change in the output volume 138, an earcon may be presented via the AUs 118 to indicate the level of sound leakage into the surrounding environment. The earcon may comprise an audio file. In one implementation, the audio file may be prepended to the audio output data 126. For example, the audio file may be inserted before the audio output data 126, such that during presentation the earcon would be heard first, followed by the sound represented by the audio output data 126. In another implementation, the audio control module 132 may present the audio file first, followed by the audio output data 126. In yet another implementation, the audio file may be inserted into another point within the audio output data 126.

While the HMWD 106 is described in the form factor of eyeglasses, the HMWD 106 may be implemented in other form factors. For example, the HMWD 106 may comprise a device that is worn behind an ear of the user 102, on a headband, as a necklace, on the shoulders, as jewelry, and so forth. In some implementations, the HMWD 106 may be deployed as a system, comprising several physically separate devices that operate in conjunction with one another. In other implementations other form factors may be used. For example, the AUs 118 and audio control module 132 may be installed within a vehicle.

Figure 2:
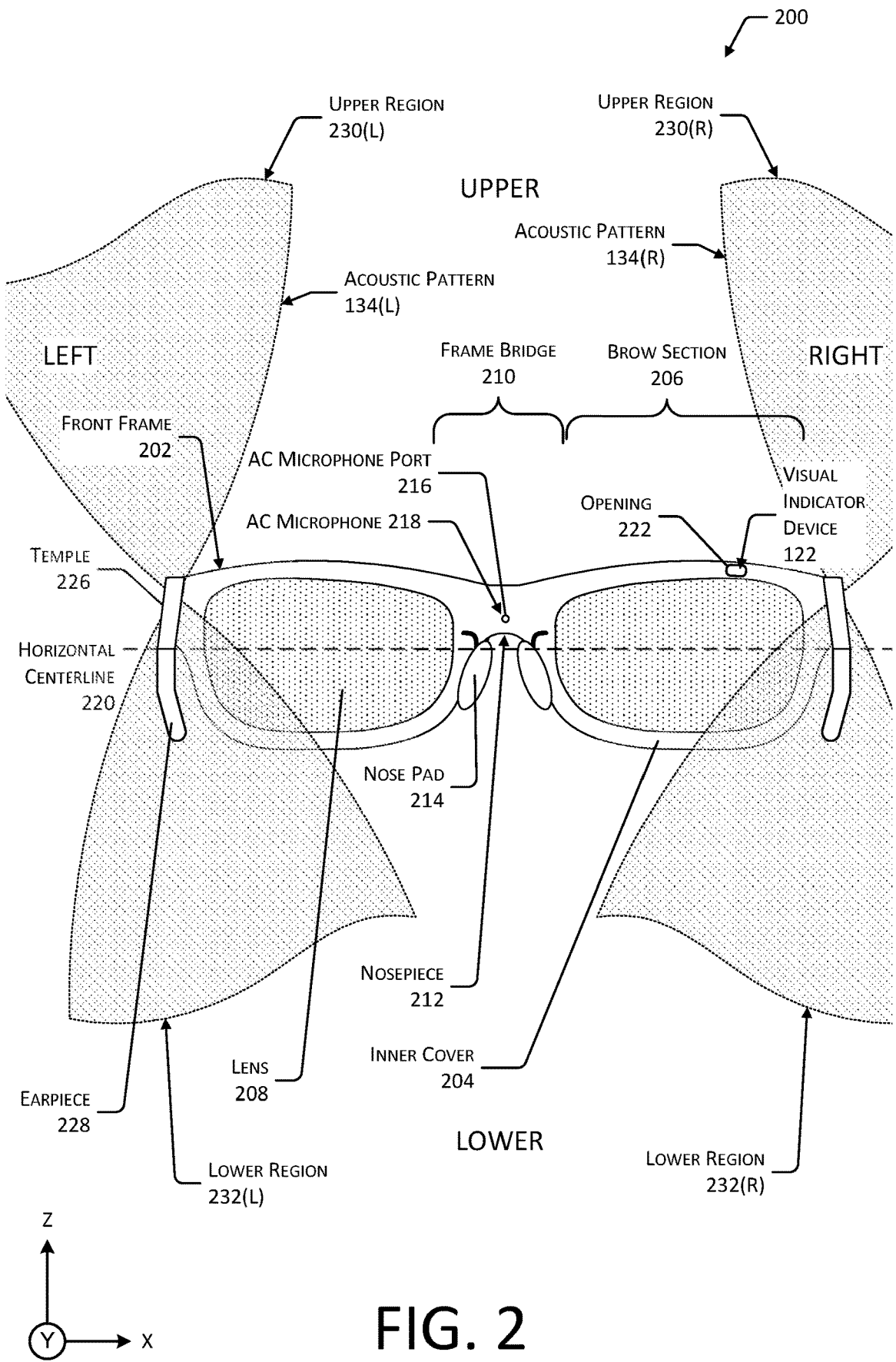
FIG. 2 depicts a view of a head-mounted wearable device, according to some implementations.

FIG. 2 depicts a view 200 of a HMWD 106, according to some implementations. This view is from the point of view of a user 102 just prior to donning the HMWD 106.

The HMWD 106 comprises a front frame 202. The front frame 202 may comprise cavities or spaces for various devices. An inner cover 204 is arranged on an interior side of the front frame 202 and closes or conceals those cavities or spaces. The inner cover 204 may be affixed to the front frame 202 by way of mechanical interference fit, fasteners, adhesives, and so forth.

The front frame 202 may include a left brow section 206(L) and a right brow section 206(R). Each brow section 206 may include a lens 208. A frame bridge 210 joins the left brow section 206(L) and the right brow section 206(R).

In some implementations, the front frame 202 may comprise a single piece of material, such as a metal, plastic, ceramic, composite material, and so forth. For example, the front frame 202 may comprise 6061 aluminum alloy that has been milled to the desired shape and to provide space for devices within. In another example, the front frame 202 may comprise injection molded plastic. In other implementations, the front frame 202 may comprise several discrete pieces that are joined together by way of mechanical engagement features, welding, adhesive, and so forth.

The lenses 208 may have specific refractive characteristics, such as in the case of prescription lenses. The lenses 208 may be clear, tinted, photochromic, electrochromic, and so forth. For example, the lenses 208 may comprise plano (non-prescription) tinted lenses to provide protection from the sun. In some implementations, only a single lens 208 may be installed, or the lenses 208 may be omitted.

A nosepiece 212 may be affixed to the frame bridge 210. One or more nose pads 214 may be affixed to, or integral with, the nosepiece 212. The nose pads 214 aid in the support of the front frame 202 and may improve comfort of the user 102.

The inner cover 204 at the frame bridge 210 may include an air conduction microphone (ACM) port 216. The ACM port 216 may comprise a passageway or hole through the inner cover 204 that allows sound vibrations to be conveyed to an ACM 218 located within the frame bridge 210.

Depicted is a horizontal centerline 220. The horizontal centerline 220 may extend through the optical centers of the lenses 208. For example, the horizontal centerline 220 may extend from left to right. In other implementations the centerline may be referenced to other points or features. For example, instead of an optical center, the centerline may be aligned to geometric center of the lens 208.

The inner cover 204 includes one or more openings 222 to provide for visibility of the visual indicator device (VID) 122. The opening 222 may provide a passage through which illumination produced by the visual indicator device 122 may pass.

In some implementations, instead of or in addition to an opening 222, the inner cover 204 may be translucent, transparent, or include a window through which the light from the visual indicator device 122 is visible to the user 102. For example, the inner cover 204 may comprise translucent plastic that transmits at least a portion of the light emitted by a light of the visual indicator device 122.

The opening 222 may be placed in an upper right quadrant of the right brow section 206(R), such as shown here. This places the light from the visual indicator device 122 within the field of view of the user 102. The opening 222 may be positioned at other locations on the inner cover 204, such as proximate to the temple 226. In other implementations additional openings 222 may be present, additional visual indicator devices 122 may be present, and so forth.

An earpiece 228 may extend from a portion of the temple 226 that is distal to the front frame 202. The earpiece 228 may comprise a material that may be reshaped to accommodate the anatomy of the head 104 of the user 102. For example, the earpiece 228 may comprise a thermoplastic that may be warmed to a predetermined temperature and reshaped. In another example, the earpiece 228 may comprise a wire that may be bent to fit. The wire may be encased in an elastomeric material.

The HMWD 106 may include one or more AUs 118. In this illustration, an AU 118 (not shown) is positioned in each of the temples 226. Each AU 118 produces an acoustic pattern 134 that comprises an upper region 230 and a lower region 232. The upper region 230 has a first sound amplitude while the lower region 232 has a second sound amplitude. In some implementations the first sound amplitude and the second sound amplitude may be the same. The lower region 232 is directed such that it encompasses at least a portion of the ear of the user 102. For example, the lower region 232(L) for the left AU 118(L) may encompass a portion of the pinna. The upper region 230 extends upwards and away from the temple 226 and the head 104 of the user 102. As described above, the acoustic pattern 134 includes an acoustically null region between the upper region 230 and the lower region 232, and exhibits a third sound amplitude that is less than the first sound amplitude and the second sound amplitude. In some implementations the acoustic pattern 134 may include two or more upper regions 230 and two or more lower regions 232.

Figure 3:
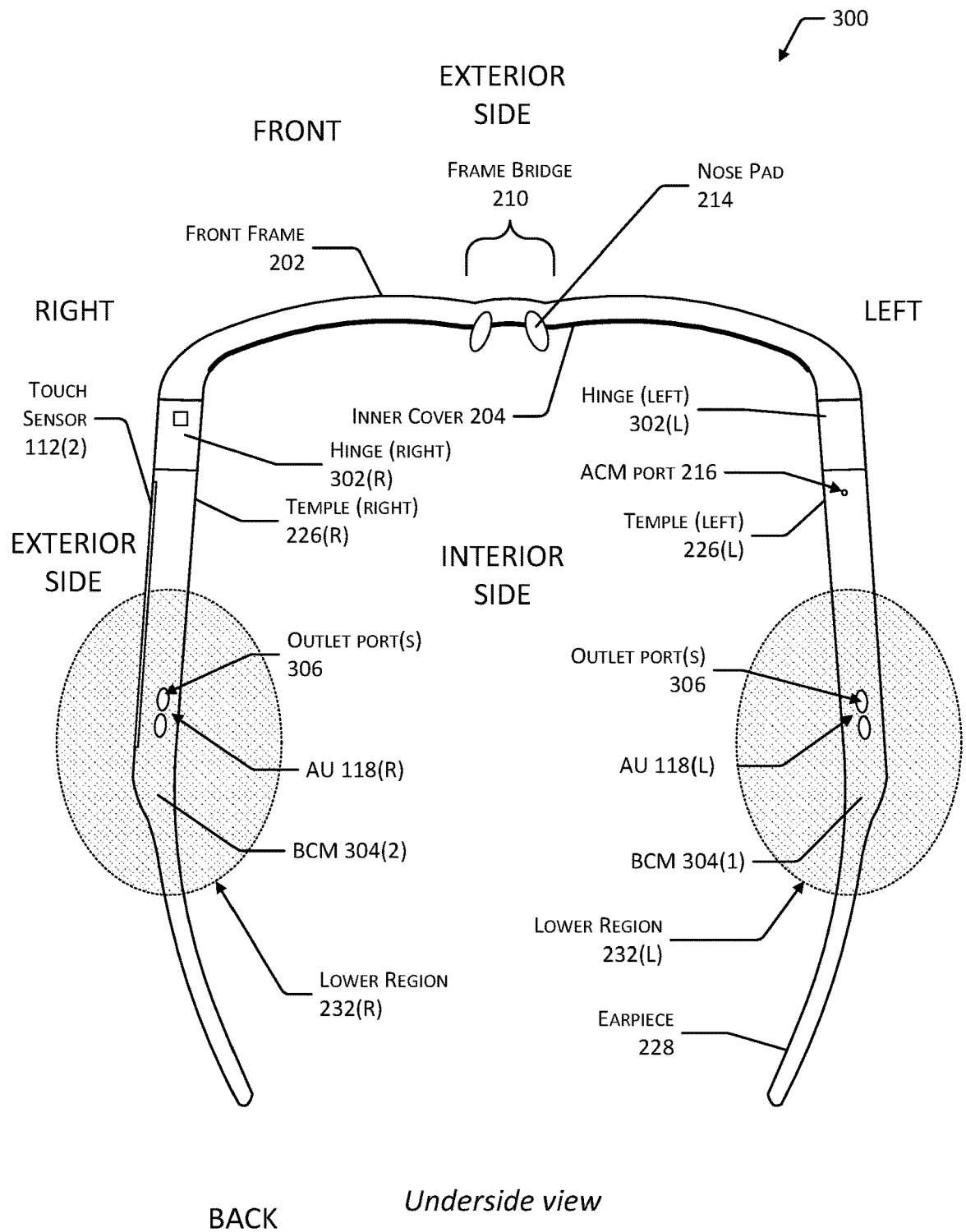
FIG. 3 depicts an exterior view, from below, of the head-mounted wearable device in an unfolded configuration, according to some implementations.

FIG. 3 depicts an exterior view 300, from below, of an underside of the HMWD 106 in an unfolded configuration, according to some implementations. In this view, the front frame 202 is visible along with the inner cover 204.

One or more hinges 302 may be affixed to, or an integral part of, the front frame 202. Depicted are a left hinge 302(L) and a right hinge 302(R) on the left and right sides of the front frame 202, respectively. The left hinge 302(L) is arranged at the left brow section 206(L), distal to the frame bridge 210. The right hinge 302(R) is arranged at the right brow section 206(R) distal to the frame bridge 210.

The temple 226 may couple to a portion of the hinge 302. For example, the temple 226 may comprise one or more components, such as a knuckle, that mechanically engage one or more corresponding structures on the hinge 302.

The left temple 226(L) is attached to the left hinge 302(L) of the front frame 202. The right temple 226(R) is attached to the right hinge 302(R) of the front frame 202.

The hinge 302 permits rotation of the temple 226 with respect to the hinge 302 about an axis of rotation. The hinge 302 may be configured to provide a desired angle of rotation. For example, the hinge 302 may allow for a rotation of between 0 and 120 degrees. As a result of this rotation, the HMWD 106 may be placed into a folded configuration. For example, each of the hinges 302 may rotate by about 90 degrees inward with the temples 226 moving toward the front frame 202.

One or more of the front frame 202, the hinge 302, or the temple 226 may be configured to dampen the transfer of vibrations between the front frame 202 and the temples 226. For example, the hinge 302 may incorporate vibration damping structures or materials to attenuate the propagation of vibrations between the front frame 202 and the temples 226. These vibration damping structures may include elastomeric materials, springs, and so forth. In another example, the portion of the temple 226 that connects to the hinge 302 may comprise an elastomeric material.

One or more different sensors or other input devices 112 may be placed on the HMWD 106. For example, the touch sensor 112(2) may be arranged along an exterior surface of the right temple 226(R). In another example, a first ACM 218(1)(not shown) may be located at the frame bridge 210, while a second ACM 218(2) is located in the left temple 226(L), a third ACM 218(3) is located in the right temple 226(R), and so forth. In another example, an ACM 218(4) may be located within or proximate to the left hinge 302(L), such as on the underside of the left hinge 302(L). The ACMs 218 may have corresponding ACM ports 216. For example, the ACM 218 may have an ACM port 216 that provides a passageway between the exterior environment and the ACM 218.

The ACM 218 may comprise a diaphragm, MEMS element, or other elements that move in response to the displacement of air by sound waves. Data produced by the ACM 218 may be generated that is indicative of the sound detected by the ACM 218. For example, the audio input data 114(1) may be generated based on input from one or more ACMs 218.

The HMWD 106 may include one or more BCMs 304. The BCM 304 is responsive to the vibrations produced by the user 102, such as while speaking. For example, the BCM 304 may comprise an accelerometer, gyroscope, vibration sensor, and so forth that detect the vibrations in the head 104 of the user 102 that result from utterances of the user 102. The BCM 304 may be arranged to be in contact with the skin above a bony or cartilaginous structure. For example, where the HMWD 106 is in the form of eyeglasses, nose pads 214 of a nosepiece 212 may be mechanically coupled to the BCM 304 such that vibrations of the nasal bone, glabella, or other structures upon which the nose pads 214 may rest are transmitted to the BCM 304. In other implementations, the BCM 304 may be located elsewhere with respect to the HMWD 106, or worn elsewhere by the user 102. For example, the BCM 304 may be incorporated into the temple 226 of the HMWD 106, a hat, or headband.

The HMWD 106 may include one or more AUs 118. For example, a first AU 118(L) is located in the left temple 226(L) and a second AU 118(R) is located in the right temple 226(R). Each AU 118 may comprise at least a pair of transducers 120.

The AU 118 may have one or more outlet ports 306 that allow sound to be transferred from the AU 118 to the surrounding environment. The outlet port 306 may comprise one or more holes that provide a passageway through an exterior housing to the exterior environment. In some implementations the outlet port 306 may be covered or filled with a grill, mesh, fabric, elastomeric material, and so forth. The outlet ports 306 may have the same size and shape, or may have different sizes and shapes. For example, the outlet port 306 that is closest to the ear of the user 102 when the HMWD 106 is being worn may be larger than the other outlet ports 306.

In this illustration, a portion of the lower regions 232 for each of the respective AU 118 are shown. In some implementations, the acoustic pattern 134 may include two or more lower regions 232, such as one corresponding to each of the outlet ports 306.

One or more buttons may be placed in other locations on the HMWD 106. For example, a button may be emplaced within, or proximate to, the right hinge 302(R), such as on an underside of the right hinge 302(R).

One or more components of the HMWD 106 may comprise single unitary pieces or may comprise several discrete pieces. For example, the front frame 202 and the nosepiece 212 may comprise a single piece, or may be constructed from several pieces joined or otherwise assembled.

Figure 4:
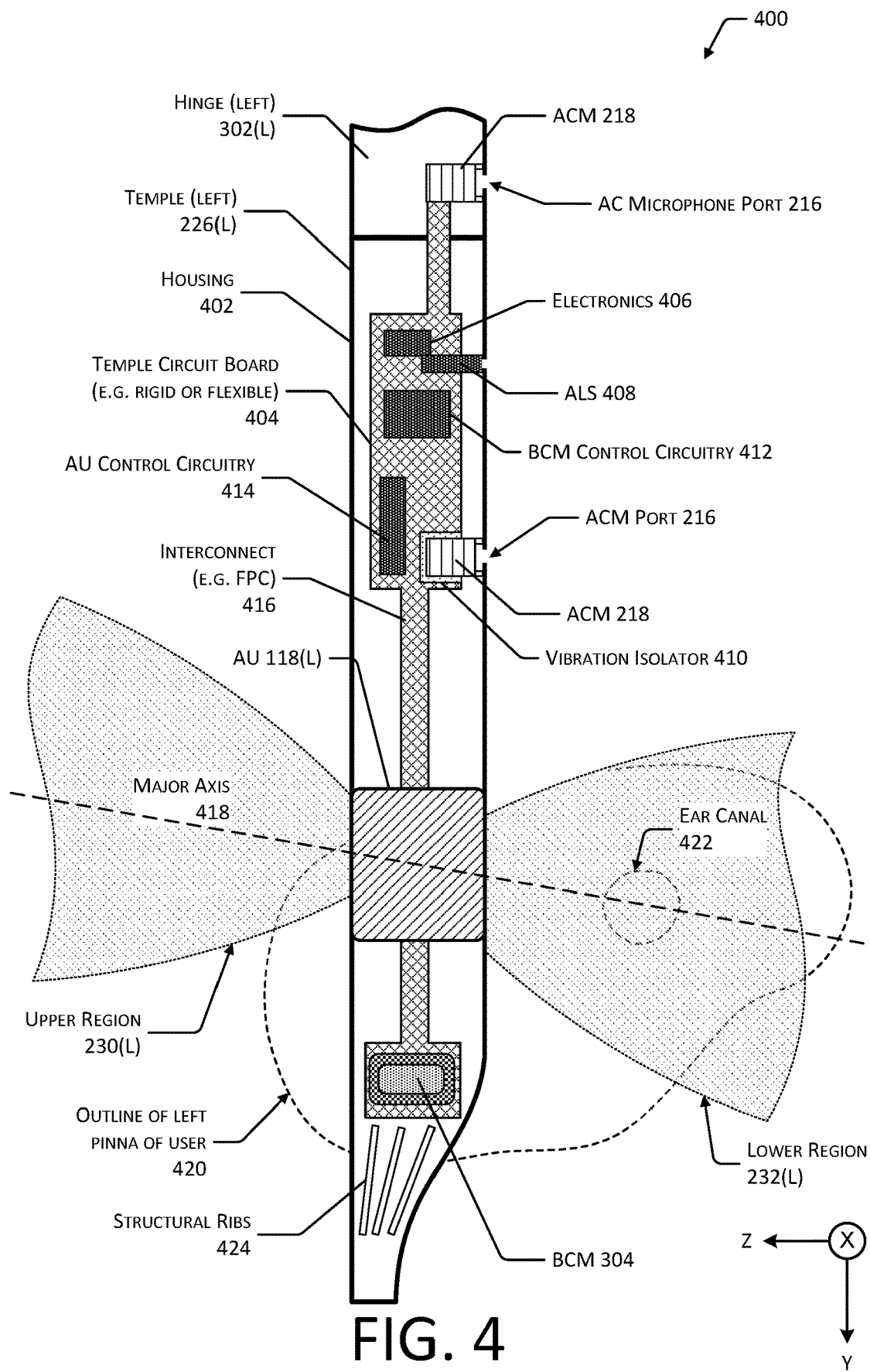
FIG. 4 depicts a view of some of the internal components of a temple of a head-mounted wearable device, according to some implementations.

FIG. 4 depicts a view 400 of some of the internal components of a left temple 226(L) of a HMWD 106, according to some implementations. The depiction of the left temple 226(L) is provided by way of example and not necessarily as a limitation. For example, the same or similar structures as described herein may be installed in the right temple 226(R).

A portion of the hinge 302 is depicted. Arranged within the hinge 302 is an ACM 218. An ACM port 216 for the ACM 218 in the hinge 302 is depicted. The ACM port 216 may open generally downwards. For example, the aperture of the ACM port 216 may be on a bottom surface of the hinge 302 and may open towards the feet of the user 102 during normal wear.

As described above, the hinge 302 is coupled to a temple 226. The temple 226 may comprise a housing 402. The housing 402 may comprise one or more elements that serve to enclose at least a portion of the temple 226. The housing 402 may comprise a plastic, metal, ceramic, composite material, and so forth.

A temple circuit board 404 is depicted. The temple circuit board 404 may comprise a rigid or flexible circuit board. For example, the temple circuit board 404 may comprise a flexible printed circuit. In some implementations, the temple circuit board 404 may extend at least partially into the hinge 302. For example, the ACM 218 may be connected to the temple circuit board 404.

Electronics 406 may be connected to, affixed to, or otherwise in communication with the temple circuit board 404. For example, integrated circuits may be laminated to the temple circuit board 404. For example, an ALS 408 may be mounted to the temple circuit board 404. A hole or window in the housing 402 may allow the sensors in the ALS 408 to detect ambient light. The window may be located on the underside as shown here, or on any other side of the temple 226. In other implementations the ALS 408 may be located elsewhere on the HMWD 106. For example, the ALS 408 may be located in the front frame 202. In another example, the ALS 408 may be mounted such that the hole or window is on an exterior surface of the temple 226, such as on a side of the temple 226 that is opposite the head 104 of the user 102.

In some implementations, a vibration isolator 410 may be used to provide some attenuation of mechanical vibration between the temple circuit board 404 and the ACM 218. For example, the vibration isolator 410 may comprise an elastomeric material such as a viscoelastic foam, acoustic foam, and so forth. In another example, the vibration isolator 410 may comprise a flexible member such as a living hinge, pleated material, flexible printed circuit board, and so forth. By attenuating the transfer of the mechanical vibration from the AU 118 to the ACM 218, the input to the ACM 218 may include less noise.

The electronics 406 may include BCM control circuitry 412 that is configured to acquire data from the BCM 304 and produce audio input data 114(1).

The electronics 406 may include AU control circuitry 414. The AU control circuitry 414 accepts audio output data 126 as input and generates one or more drive signals. For example, the I/O module may provide the audio output data 126 to the AU control circuitry 414. In one implementation, the AU control circuitry 414 may comprise a digital to analog converter (DAC) and a power amplifier. The DAC converts the output data to an analog signal, which may then be amplified using a power amplifier to produce a drive signal. The drive signal is then provided to the one or more emitters of the AU 118. The one or more emitters may utilize a movable element, such as a diaphragm, that displaces air to produce sound.

The AU control circuitry 414 may be configured to deliver different electrical signals to drive the emitters in particular ways. For example, the AU control circuitry 414 may comprise a digital-to-analog converter (DAC) that changes sound that is digitally represented as audio output data into an analog waveform. The analog waveform may then be amplified and provided to the transducers 120 in the emitters. In some implementations the AU control circuitry 414 may generate different electrical signals to drive different transducers 120. For example, the AU control circuitry 414 may implement at least a portion of the inversion module 148 as described above. In another example, the AU control circuitry 414 may introduce a phase difference between a first electrical signal being sent to a first transducer in a first emitter and a second electrical signal being sent to a second transducer in a second emitter.

An interconnect 416 may be used to connect the temple circuit board 404 to one or more of the AU 118, the BCM 304, and so forth. The interconnect 416 may comprise a flexible printed circuit, wiring harness, and so forth to provide an electrical connection. In some implementations, the interconnect 416 may comprise an extension of the temple circuit board 404.

The AU 118 may be connected to, or may include, one or more outlet ports 306 (not shown). The outlet ports 306 may be located at one or more locations on the temple 226, such as described below. During operation the acoustic pattern 134 is produced as described above. The acoustic pattern 134 includes a major axis 418. The major axis 418 may comprise a line that extends along a long axis of each of the upper region 230 and the lower region 232.

Also depicted is an approximate location of an outline of a pinna 420 of the left ear of the user 102 when the HMWD 106 is being worn. Also shown is an approximate location of an ear canal 422 of the user's 102 left ear. As shown here, the major axis 418 of the acoustic pattern 134 is arranged such that the ear canal 422 is within the lower region 232. For example, as depicted here, the lower edge of the major axis 418 may pass through the ear canal 422. In other implementations, the major axis 418 may be arranged at other angles.

While the AU 118 is depicted as being within the housing 402 of the temple 226, in other implementations the AU 118 or portions thereof may be outside of the housing 402.

Depicted in this illustration are structural ribs 424. The structural ribs 424 may be used to add rigidity to a distal portion of the temple 226. The structural ribs 424 may also improve structural support for the earpiece 228 (not shown).

Figure 5:
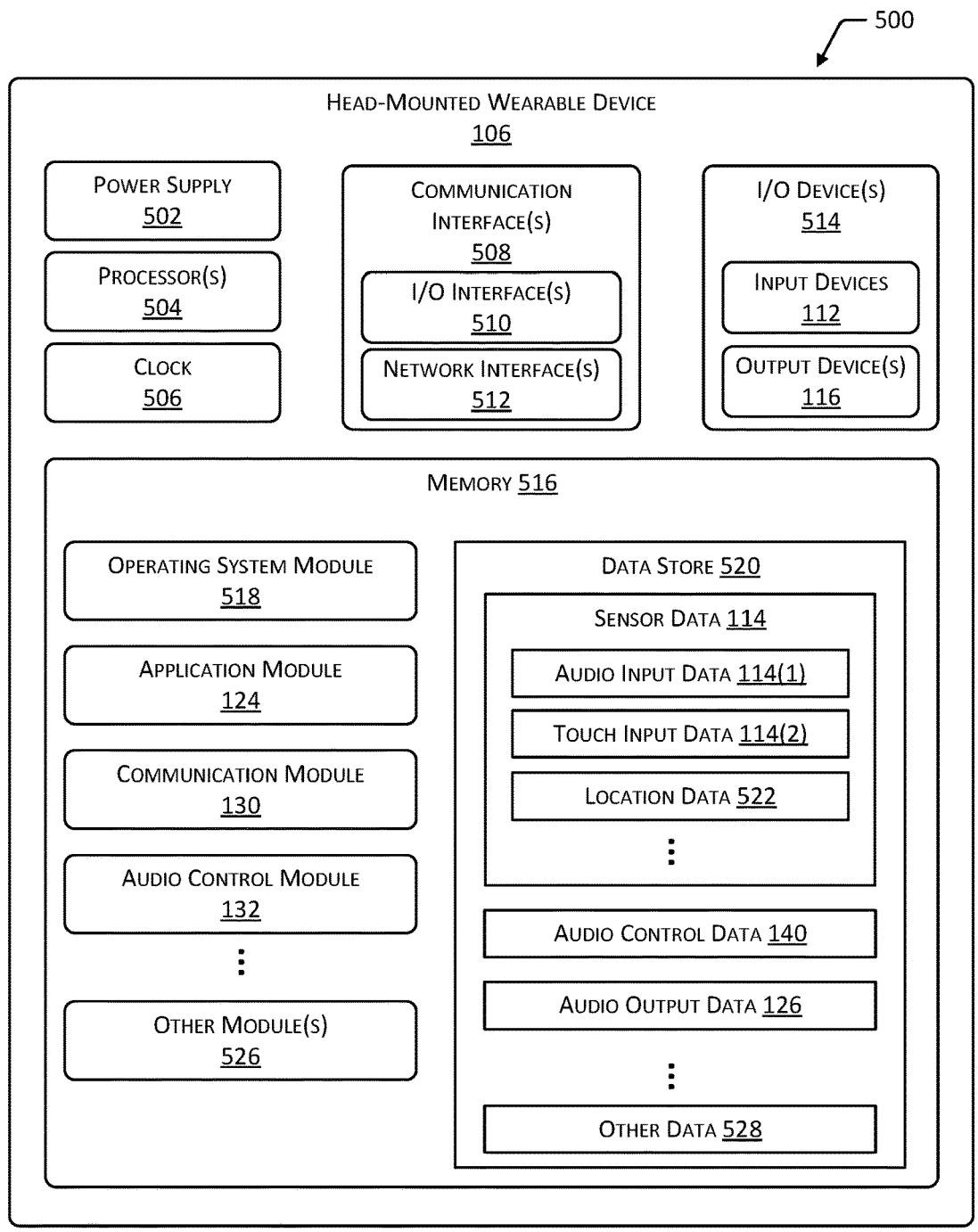
FIG. 5 is a block diagram of electronic components of the head-mounted wearable device, according to some implementations.

FIG. 5 is a block diagram 500 of components of the head-mounted wearable device 106, according to some implementations.

One or more power supplies 502 may be configured to provide electrical power suitable for operating the components in the HMWD 106. The one or more power supplies 502 may comprise batteries, capacitors, fuel cells, photovoltaic cells, wireless power receivers, conductive couplings suitable for attachment to an external power source such as provided by an electric utility, and so forth. For example, the batteries on board the HMWD 106 may be charged wirelessly, such as through inductive or capacitive power transfer. In another implementation, electrical contacts may be used to recharge the HMWD 106.

The HMWD 106 may include one or more hardware processors 504 (processors) configured to execute one or more stored instructions. The processors 504 may comprise one or more cores. The processors 504 may include general purpose microprocessors, microcontrollers, application specific integrated circuits (ASICs), digital signal processors (DSPs), and so forth. One or more clocks 506 may provide information indicative of date, time, ticks, and so forth. For example, the processor 504 may use data from the clock 506 to associate a particular interaction with a particular point in time.

The HMWD 106 may include one or more communication interfaces 508 such as input/output (I/O) interfaces 510, network interfaces 512, and so forth. The communication interfaces 508 enable the HMWD 106, or components thereof, to communicate with other devices or components. The communication interfaces 508 may include one or more I/O interfaces 510. The I/O interfaces 510 may comprise Inter-Integrated Circuit (I2C), Serial Peripheral Interface bus (SPI), Universal Serial Bus (USB) as promulgated by the USB Implementers Forum, RS-232, and so forth.

The I/O interface(s) 510 may couple to one or more I/O devices 514. The I/O devices 514 may include input devices 112. The input devices 112 may include but are not limited to, the touch sensor 112(2), the ALS 408, the ACM 218, the BCM 304, a camera, a proximity sensor, a barometer, a light sensor, an inertial measurement unit (IMU), a biomedical sensor, a magnetometer, and so forth. The IMU may comprise one or more of accelerometers or gyroscopes. Motion data may be acquired from the IMU. For example, the motion data may be used for fitness tracking, navigation, augmented reality, virtual reality, and so forth. The biomedical sensor may include one or more of a pulse sensor, oximeter, electrocardiograph, encephalograph, myograph, respirometer, and so forth. Biomedical data may be acquired from one or more of the biomedical sensors. For example, the biomedical data may be used for fitness tracking.

The I/O devices 514 may also include the output devices 116. The output devices 116 may include but are not limited to one or more AUs 118, the VID 122, haptic output devices, and so forth. In some embodiments, the I/O devices 514 may be physically incorporated with the HMWD 106 or may be externally placed.

The network interfaces 512 may be configured to provide communications between the HMWD 106 and other devices, such as the server. The network interfaces 512 may include devices configured to couple to personal area networks (PANs), wired or wireless local area networks (LANs), wide area networks (WANs), and so forth. For example, the network interfaces 512 may include devices compatible with Ethernet, Wi-Fi, Bluetooth, Bluetooth Low Energy, ZigBee, and so forth.

The HMWD 106 may also include one or more busses or other internal communications hardware or software that allow for the transfer of data between the various modules and components of the HMWD 106.

As shown in FIG. 5, the HMWD 106 includes one or more memories 516. The memory 516 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 516 provides storage of computer-readable instructions, data structures, program modules, and other data for the operation of the HMWD 106. A few examples of functional modules are shown stored in the memory 516, although the same functionality may alternatively be implemented in hardware, firmware, or as a system on a chip (SoC).

The memory 516 may include at least one operating system (OS) module 518. The OS module 518 is configured to manage hardware resource devices such as the I/O interfaces 510, the I/O devices 514, the communication interfaces 508, and provide various services to applications or modules executing on the processors 504. The OS module 518 may implement a variant of the FreeBSD operating system as promulgated by the FreeBSD Project; other UNIX or UNIX-like variants; a variation of the Linux operating system as promulgated by Linus Torvalds; the Windows operating system from Microsoft Corporation of Redmond, Wash., USA; and so forth.

Also stored in the memory 516 may be a data store 520 and one or more of the following modules. These modules may be executed as foreground applications, background tasks, daemons, and so forth. The data store 520 may use a flat file, database, linked list, tree, executable code, script, or other data structure to store information. In some implementations, the data store 520 or a portion of the data store 520 may be distributed across one or more other devices including servers, network attached storage devices, and so forth.

The memory 516 may store the sensor data 114 as described above. The sensor data 114 may include location data 522 that is indicative of a location of the HMWD 106. The location data 522 may indicate a latitude and longitude, country, state, city, street address, zip code, and so forth. The location data 522 may be obtained from an input device 112 such as a satellite radio navigation system, from an external source such as a cellular data network, and so forth. The location data 522 may be used by the audio control module 132 to operate the AU 118. For example, different sound settings may be used based on the location data 522, the time of day, and so forth.

The memory 516 may store one or more application modules 124. For example, the application module 124 may comprise functionality such as providing calendar reminders, presenting information to the user 102, and so forth.

The memory 516 may store the communication module 130 that is configured to establish communications with one or more of the computing devices 108, other HMWDs 106, servers, input devices 112, or other devices. The communications may be authenticated, encrypted, and so forth.

The memory 516 may store the audio control module 132 as described above. In some implementations, one or more functions associated with the audio control module 132 may be performed by one or more processors 504. For example, a DSP may perform the functions of the equalizer module 142 and the inversion module 148.

Other modules 526 may also be present in the memory 516 as well as other data 528 in the data store 520.

FIG. 6 illustrates audio control data 140 that may be used by an audio control module 132 to operate the acoustic units 118, according to some implementations. The audio control data 140 is depicted as a table for ease of illustration, and not necessarily as a limitation. In other implementations other data structures may be used.

The audio control data 140(1) may relate a range of ambient noise levels 602 with a particular output volume 138. For example, in this illustration an ambient noise level 602 of between 0 and 16 is associated with an output volume 138 of 1. The audio control data 140(1) may be used by the volume module 136 to determine the output volume 138 based at least in part on the ambient noise level 602.

The audio control data 140(2) may associate one or more of ambient noise level 602, output volume 138, audio type data 128, equalization profile 144, inversion frequency 150, indicator output data 154, or other data. In one implementation, the audio control data 140(2) may be stored as a table and, given particular parameters, used to lookup an equalization profile 144 and inversion frequency 150. For example, if the ambient noise level 602 as determined using the audio input data 114(1) has a value of "93", the output volume 138 as set by the user has a value of "8", and the audio type data 128 provided by the current application module 124 generating audio output data 126 indicates "phone", then equalization profile 144(2) would be used by the equalizer module 142 and the inversion frequency 150 of "3000 Hz" would be used by the inversion module 148.

Various combinations of inputs may be used to select the parameters to operate the audio control module 132. For example, the output volume 138 as set based on user input from the touch input data 114(2) may be used to determine the equalization profile 144 and the inversion frequency 150. In another example, the ambient noise level 602 and the output volume 138 may be used to determine the inversion frequency 150.

The audio control data 140(2) may also be used to determine the indicator output data 154. For example, the indicator output data 154 associated with a particular combination of ambient noise level 602, equalization profile 144, and inversion frequency 150 in use, may be used to operate the VID 122.

FIG. 7 shows a graph 700 of two equalization profiles 144, according to some implementations. In this graph, frequency 702 is depicted along a horizontal axis while a vertical axis indicates a gain (in decibels) 704 of a change to be applied to the signal. Positive gain values indicate amplification while negative magnitudes indicate attenuation. For example, the equalization profile 144 may describe the characteristics of a particular parametric equalizer configuration.

The characteristics of the equalization profile 144 affect the sound leakage to the surrounding environment. For example, attenuation of frequencies above a threshold value may minimize sound leakage.

A first equalization profile 144(1) exhibits a gain 704 of −10 dB at about 7 kHz. The gain at approximately 7 kHz may be used to compensate for a resonance peak of the transducer 120. The first equalization profile 144(1) may be used when the ambient noise level is above a threshold value. For example, the first equalization profile 144(1) provides approximately −10 dB of gain 704 peaking at about 7 kHz. The second equalization profile 144(2) may be used when the ambient noise level is below the threshold value. For example, the second equalization profile 144(2) provides approximately −25 dB of gain peaking at about 7 kHz.

Figure 8:
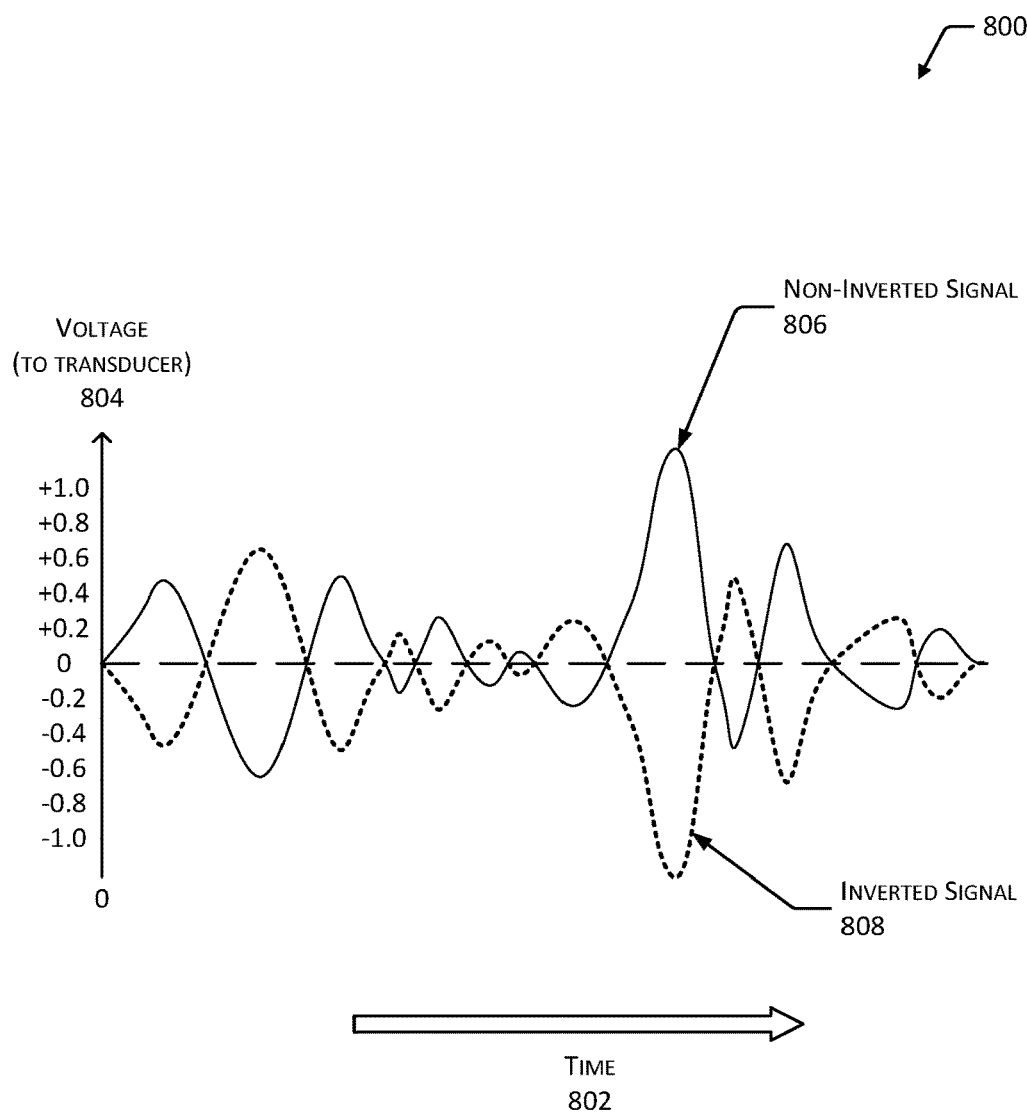
FIG. 8 shows a graph of a non-inverted signal and an inverted signal, according to some implementations.

FIG. 8 shows a graph 800 of a non-inverted signal and an inverted signal, according to some implementations. In this graph, time 802 is depicted along a horizontal axis while a vertical axis indicates a voltage 804 of an analog signal applied to a transducer 120. A non-inverted signal 806, such as that produced from a portion of the equalized audio output data 146 as generated by a first DAC is shown. Also shown is an inverted signal 808, such as that produced from a corresponding portion of the inverted audio output data 152 as generated by a second DAC. At any given instant in time, the voltage 804 of the non-inverted signal 806 has the same magnitude but opposite sign as the inverted signal 808. By using the non-inverted signal 806 to drive a first transducer 120(1) and the inverted signal 808 to drive a second transducer 120(2) in the same AU 118 at the same time, the AU 118 operates as an acoustic quadrupole.

Figure 9:
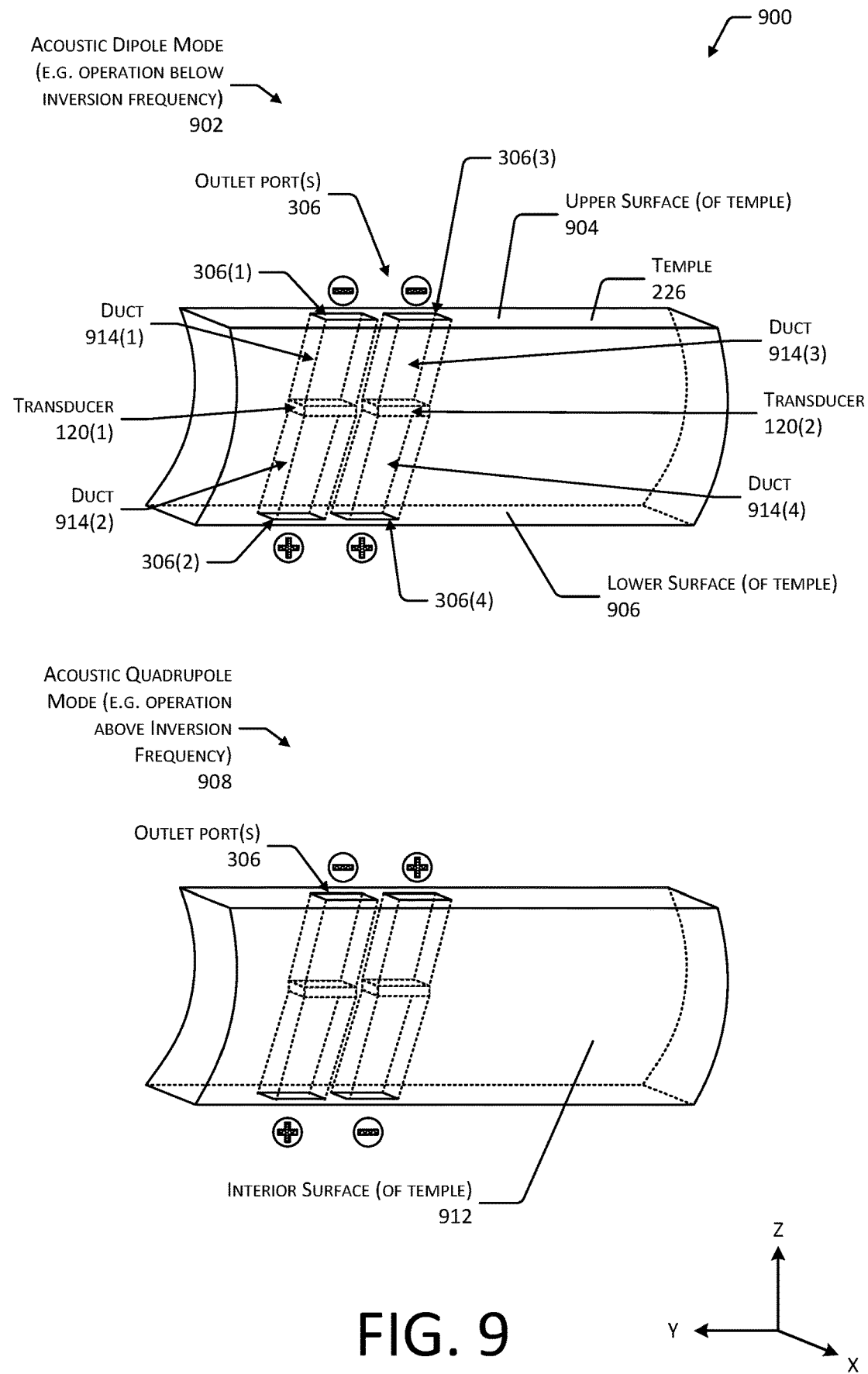
FIG. 9 illustrates a portion of the HMWD with the acoustic units when operated in an acoustic dipole mode and in an acoustic quadrupole mode, according to some implementations.

FIG. 9 depicts different arrangements 900 of phase output of sound at outlet ports 306 in the housing 402 of the temple 226 as produced by a first transducer 120(1) and a second transducer 120(2) in the AU 118 as driven by the audio control module 132.

At 902 the system is shown when operating in an acoustic dipole mode, such as occurs when the signal being presented by the AU 118 is below the inversion frequency 150.

The housing 402 of the temple 226 comprises an upper surface 904 and a lower surface 906. The AU 118 includes a first transducer 120(1) that is connected via a first duct 914(1) to the outlet port 306(1) on the upper surface 904 and a second duct 914(2) to the outlet port 306(2) on the lower surface 906. A second transducer 120(2) that is connected via a third duct 914(3) to the outlet port 306(3) on the upper surface 904 and a fourth duct 914(4) to the outlet port 306(4) on the lower surface 906. The ducts 914 provide a passageway for sound to travel from the transducer 120 to the outlet ports 306, and then into the exterior environment.

While operating below the inversion frequency 150, the outlet ports 306(1) and 306(3) on the upper surface 904 emit sound with a first phase. Likewise, the outlet ports 306(2) and 306(4) on the lower surface 906 emit sound with a second phase.

At 908 the system is shown when operating in an acoustic quadrupole mode, such as occurs when the signal being presented by the AU 118 is greater than the inversion frequency 150. While operating above the inversion frequency 150, the outlet ports 306(1) and 306(4) emit sound with the first phase while the outlet ports 306(2) and 306(3) emit sound with the second phase.

In some implementations a pair of AUs 118 may operate as an acoustic octupole. For example, the left AU 118(L) in the left temple 226(L) may operate above the inversion frequency 150 in the mode shown at 908. Continuing the example, a right AU 118(R) in the right temple 226(R) may operate above the inversion frequency 150 with opposite phase, producing at the output ports 306 in the right temple 226(R) sound with the second phase at the outlet ports 306(1) and 306(4) and sound with the first phase at the outlet ports 306(2) and 306(3). When operating in the octupole mode, the sound phase emitted from the outlet ports 306 alternates between the AUs 118. For example, moving around a perimeter of the HMWD 106 the phase during octupole operation of four outlet ports 306 on a lower surface 906 of their respective temples 226 would be first phase, second phase, first phase, second phase.

The acoustic octupole configuration may further reduce audio leakage into the surrounding environment. For example, destructive interference from the emitted sound may now take place to the front, right, rear, and left of the HMWD 106.

Figure 10:
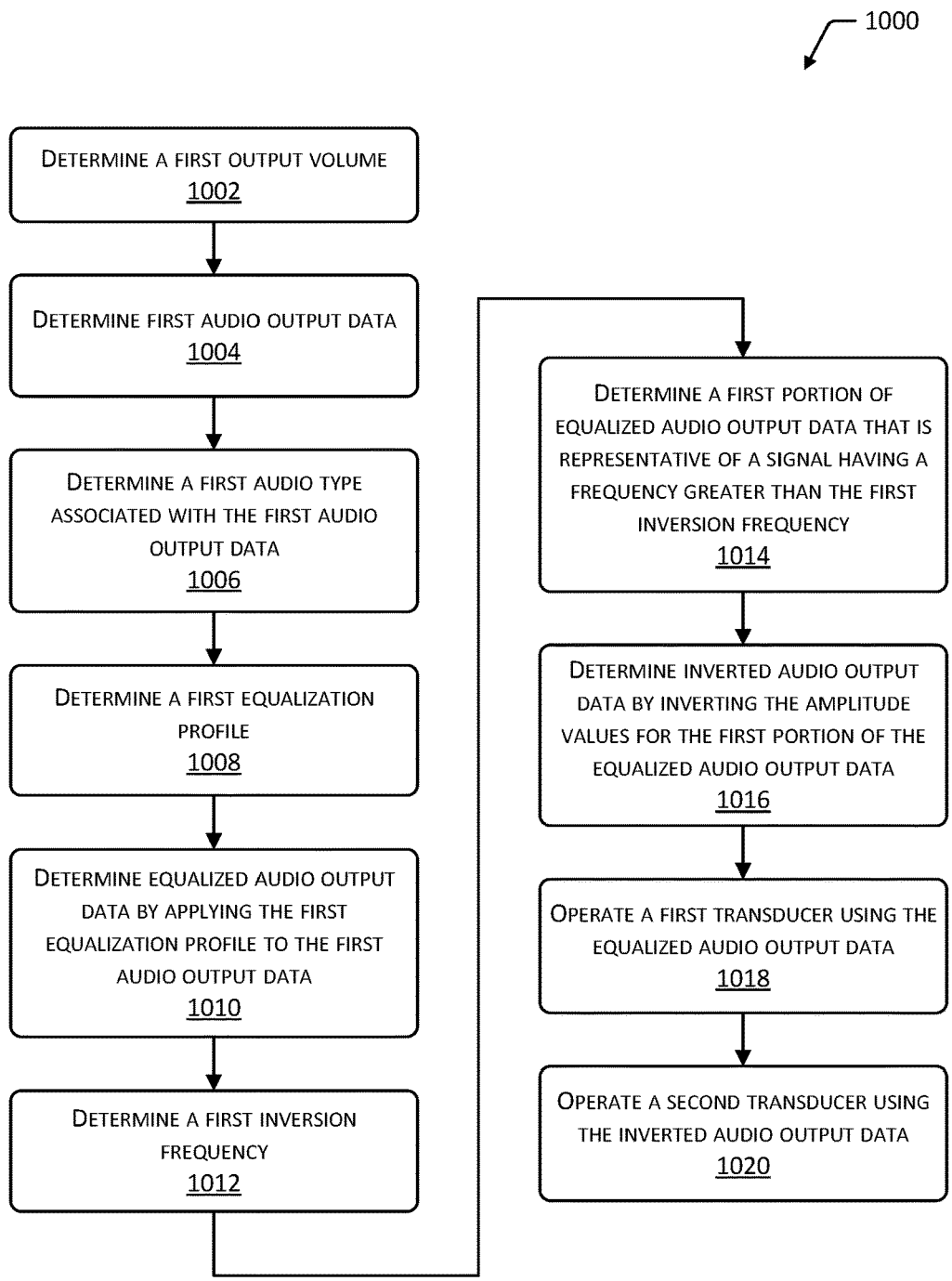
FIG. 10 is a flow diagram of a process to operate transducers in acoustic units to minimize sound leakage into a surrounding environment, according to another implementation.

FIG. 10 is a flow diagram 1000 of a process to operate transducers 120 in acoustic units 118 to minimize sound leakage into a surrounding environment, according to another implementation. The process may be implemented at least in part by the audio control module 132.

At 1002 a first output volume 138 is determined. For example, the user 102 may select an output volume 138 using the touch sensor 112(2). In another example, the volume module 136 may determine the output volume 138 based at least in part on audio input data 114(1), such as indicative of an ambient noise level. For example, the microphone 112(1) may be connected to an analog to digital converter (ADC) that generates the audio input data 114(1) comprising a digital representation of sounds detected by the microphone 112(1). In one implementation, an ambient noise level may be determined by determining an average amplitude of the audio input for a first time interval. For example, amplitude values of samples within a first time interval may be averaged to determine an average amplitude indicative of the ambient noise level. The average amplitude may be used to retrieve, from previously stored data, the first output volume 138 that is associated with that average amplitude.

At 1004 determine first audio output data 126. For example, the first audio output data 126 may be provided by the application module 124.

At 1006 determine first audio type data 128 associated with the first audio output data 126. For example, the first audio type data 128 may indicate that the first audio output data 126 is "phone", indicative of presentation of a human voice. In one implementation, the first audio type data 128 may be determined using data associated with the first audio output data 126. For example, the first audio output data 126 may include a file header or metadata that is indicative of the audio type. In another implementation, at least a portion of the first audio output data 126 may be analyzed to determine the audio type. For example, a voice activity detector may be used to determine if the first audio output data 126 represents human speech.

At 1008 a first equalization profile 144 is determined. In one implementation, the first equalization profile 144 may be selected from a plurality of previously stored equalization profiles 144 based at least in part on one or more of the first output volume 138, ambient noise level, audio type data 128, and so forth. For example, previously stored data, such as the audio control data 140, may be used. A particular input, such as the first output volume 138 or the ambient noise level, or the audio type data 128, may be used to retrieve a particular equalization profile 144 that is associated with that input.

At 1010 first equalized audio output data 146 is determined from the first audio output data 126. For example, the equalizer module 142 may determine the first equalized audio output data 146 by applying the audio output data 126 to the first equalization profile 144.

At 1012 a first inversion frequency 150 is determined. In one implementation, the first inversion frequency 150 may be determined based at least in part on one or more of the first output volume 138, ambient noise level, audio type data 128, and so forth. For example, previously stored data, such as the audio control data 140, may be used. A particular input, such as the first output volume 138 or the ambient noise level, or the audio type data 128, may be used to retrieve a particular inversion frequency 150 that is associated with that input.

At 1014 a first portion of first equalized audio output data 146 is determined that is representative of a signal having a frequency greater than the first inversion frequency 150. For example, the inversion module 148 may determine portions of PCM data in which the samples having an output frequency greater than the first inversion frequency 150.

At 1016 inverted audio output data 152 is determined from the first equalized audio output data 146. For example, amplitude values for the first portion of the equalized audio output data 146 may be inverted.

At 1018 a first transducer 120(1) is operated using the equalized audio output data 146. The first transducer 120(1) and a second transducer 120(2) may comprise an acoustic unit 118.

At 1020 a second transducer 120(2) is operated using the inverted audio output data 152. During operation, the acoustic unit 118 operates as an acoustic dipole for reproduction of sounds below the inversion frequency 150 and as an acoustic quadrupole for reproduction of sounds greater than the inversion frequency 150.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include but are not limited to signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case and a variety of alternative implementations will be understood by those having ordinary skill in the art.

Specific physical embodiments as described in this disclosure are provided by way of illustration and not necessarily as a limitation. Those having ordinary skill in the art readily recognize that alternative implementations, variations, and so forth may also be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features, structures, and acts are disclosed as exemplary forms of implementation.

What is claimed is:

1. A head-mounted wearable device comprising:
   a front frame;
   a first temple connected to the front frame, wherein the first temple comprises:
      a housing having an upper surface and a lower surface;
      a first acoustic dipole comprising:
         a first transducer and a first duct that directs sound from a first side of the first transducer to a first outlet port in the upper surface and a second duct that directs sound from a second side of the first transducer to a second outlet port in the lower surface; and
      a second acoustic dipole comprising:
         a second transducer and a third duct that directs sound from a first side of the second transducer to a third outlet port in the upper surface that is near the first outlet port and a fourth duct that directs sound from a second side of the second transducer to a fourth outlet port in the lower surface that is near the second outlet port;
   one or more memories storing first computer-executable instructions; and
   one or more hardware processors to execute the first computer-executable instructions to:
      determine a first volume value indicative of a selected output volume;
      determine a first equalization profile that is associated with the first volume value, wherein the first equalization profile specifies gain at a first frequency;
      determine a first inversion frequency that is associated with the first volume value;
      determine first audio output data to be presented;
      determine first equalized audio output data by applying the first equalization profile to the first audio output data;
      determine inverted audio output data by inverting an amplitude of portions of the first equalized audio output data that are greater than the first inversion frequency;
      operate the first transducer using the first equalized audio output data; and
      operate the second transducer using the inverted audio output data.

2. The head-mounted wearable device of claim 1, wherein the first equalized audio output data comprises a plurality of samples and each sample includes data indicative of an amplitude sign; and
   the first computer-executable instructions to determine the inverted audio output data further comprise instructions to:
      determine a sample represents a frequency greater than the first inversion frequency; and
      invert data indicative of an amplitude sign associated with the sample.

3. A system comprising:
a first transducer;
a second transducer;
one or more memories storing computer-executable instructions; and
one or more hardware processors to execute the computer-executable instructions to:
  determine a first output volume;
  determine, based at least in part on the first output volume, a first inversion frequency;
  determine a first portion of first audio output data, wherein the first portion is representative of a signal having a frequency greater than the first inversion frequency;
  determine inverted audio output data by inverting amplitude values for the first portion of the first audio output data;
  generate, using the first audio output data as input to a first digital to analog converter (DAC), a first signal;
  drive the first transducer using the first signal;
  generate, using the inverted audio output data as input to a second DAC, a second signal; and
  drive the second transducer using the second signal.

4. The system of claim 3, further comprising:
a first duct having a first end connected to a first side of the first transducer;
a first outlet port on a first surface, wherein the first outlet port is connected to a second end of the first duct;
a second duct having a first end connected to a second side of the first transducer;
a second outlet port on a second surface, wherein the second outlet port is connected to a second end of the second duct;
a third duct having a first end connected to a first side of the second transducer;
a third outlet port on the first surface, wherein the third outlet port is connected to a second end of the third duct;
a fourth duct having a first end connected to a second side of the second transducer; and
a fourth outlet port on the second surface, wherein the fourth outlet port is connected to a second end of the fourth duct.

5. The system of claim 3, further comprising:
a front frame; and
a first temple attached with a first hinge to the front frame, wherein the first transducer and the second transducer are mounted to the first temple.

6. The system of claim 3, the one or more hardware processors to further execute the computer-executable instructions to:
retrieve the first inversion frequency from previously stored data that associates the first inversion frequency with a first range of output volumes, wherein the first output volume is within the first range of output volumes;
determine a second output volume that is greater than the first output volume; and
retrieve a second inversion frequency from the previously stored data that associates the second inversion frequency with a second range of output volumes, wherein the second output volume is within the second range of output volumes and the second inversion frequency is greater than the first inversion frequency.

7. The system of claim 3, the one or more hardware processors to further execute the computer-executable instructions to:
receive second audio output data for presentation using the first transducer and the second transducer;
retrieve, from previously stored data that associates output volume with an equalization profile, a first equalization profile using the first output volume as input, wherein the first equalization profile specifies a gain of −25 decibels at 7 kilohertz (kHz); and
generate the first audio output data from the second audio output data by reducing amplitude values of the second audio output data that are associated with a frequency of 7 kHz by 25 decibels.

8. The system of claim 7, the one or more hardware processors to further execute the computer-executable instructions to:
determine an application that is sending the first audio output data;
retrieve an audio type from previously stored data that associates the audio type with the application; and
retrieve the first equalization profile from previously stored data that associates the audio type with the first equalization profile.

9. The system of claim 3, further comprising:
a microphone connected to an analog to digital converter (ADC) that generates audio input comprising a digital representation of sound detected by the microphone; and
the one or more hardware processors to further execute the computer-executable instructions to:
  determine an average amplitude of the audio input; and
  retrieve, from previously stored data, the first output volume associated with the average amplitude.

10. The system of claim 9, the one or more hardware processors to further execute the computer-executable instructions to:
determine an average amplitude of the audio input for a plurality of audio samples acquired over a first time interval; and
retrieve, from previously stored data that associates average amplitude values with output volume values, the first output volume using the average amplitude as an input.

11. The system of claim 3, further comprising:
a microphone connected to an analog to digital converter (ADC) that generates audio input comprising a digital representation of sound detected by the microphone; and
the one or more hardware processors to further execute the computer-executable instructions to:
  determine an ambient noise level based on the audio input; and
  retrieve, from previously stored data that associates an inversion frequency with an ambient noise level, the first inversion frequency.

12. The system of claim 3, further comprising:
a light emitting diode (LED); and
the one or more hardware processors to further execute the computer-executable instructions to:
  retrieve, from previously stored data that associates an inversion frequency with a color value, a color value associated with the first inversion frequency; and
  operate the LED to illuminate with a color specified by the color value.

13. The system of claim 3, the one or more hardware processors to further execute the computer-executable instructions to:

retrieve, from previously stored data that associates an inversion frequency with an audio file, an audio file associated with the first inversion frequency; and generate the first audio output data by prepending the audio file to second audio output data.

14. A method comprising:

determining a first output volume;

determining, based at least in part on the first output volume:
- a first equalization profile; and
- a first inversion frequency;

determining audio output data;

determining first equalized audio output data by applying the first equalization profile to the audio output data;

determining a first portion of the first equalized audio output data that represents a signal greater than the first inversion frequency;

determining inverted audio output data by inverting the first portion of the first equalized audio output data;

operating a first transducer using the first equalized audio output data; and operating a second transducer using the inverted audio output data.

15. The method of claim 14, the determining the first equalization profile and the first inversion frequency comprising:

retrieving, from previously stored data, the first equalization profile that is associated with the first output volume; and retrieving, from the previously stored data, the first inversion frequency that is associated with the first output volume.

16. The method of claim 14, wherein the first equalization profile specifies a first range of frequencies and a first gain factor for signals having a frequency within the first range; and the determining the first equalized audio output data by applying the first equalization profile to the audio output data comprising:

generating the first equalized audio output data from the audio output data by using the first gain factor to change amplitude values of the audio output data that are associated with the first range of frequencies.

17. The method of claim 14, wherein the first equalized audio output data comprises a first set of audio samples, each audio sample in the first set of audio samples encoding an amplitude value associated with a particular time interval; and the determining the first portion of the first equalized audio output data comprising:

calculating a first frequency using the first set of audio samples; and determining the first frequency is greater than the first inversion frequency.

18. The method of claim 14, wherein the first equalized audio output data comprises a plurality of samples and each sample includes data indicative of an amplitude sign; and the determining the inverted audio output data comprising:

inverting the data indicative of the amplitude sign for the each sample in the first portion of the first equalized audio output data.

19. The method of claim 14, the operating the first transducer comprising:

generating, using the first equalized audio output data as input to a first digital to analog converter (DAC), a first signal;

driving the first transducer using the first signal;

the operating the second transducer comprising:

generating, using the inverted audio output data as input to a second DAC, a second signal; and driving the second transducer using the second signal.

20. The method of claim 14, further comprising:

determining an audio type associated with the audio output data; and retrieving, from previously stored data, the first equalization profile using the audio type.

21. The method of claim 14, wherein the first inversion frequency is inversely proportionate to the first output volume such that a second output volume that is greater than the first output volume is associated with a second inversion frequency that is greater than the first inversion frequency.

* * * * *